(12) United States Patent
Venkiteswaran et al.

(10) Patent No.: US 9,178,499 B2
(45) Date of Patent: Nov. 3, 2015

(54) LOW-POWER OFFSET-STORED LATCH

(71) Applicant: Texas Instruments Incorporated, Dallas, TX (US)

(72) Inventors: Mahadevan Venkiteswaran, Bangalore (IN); Rajavelu Thinakaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 14/191,906

(22) Filed: Feb. 27, 2014

(65) Prior Publication Data

US 2015/0244355 A1   Aug. 27, 2015

(51) Int. Cl.
*H03M 1/38*   (2006.01)
*H03K 3/356*   (2006.01)

(52) U.S. Cl.
CPC ........... *H03K 3/356165* (2013.01); *H03M 1/38* (2013.01)

(58) Field of Classification Search
CPC ............ H01L 27/0921; H01L 27/1104; H01L 27/1108; H01L 27/823878; H03K 3/012; H03K 3/013; H03K 3/0375; H03K 3/3565; H03K 3/315; H03K 3/356147; H03K 3/356156; H03M 1/12; H03M 1/662; H03M 1/1023; H03M 1/1095; H03M 1/1009; G11C 16/10; G11C 16/26
USPC .............. 365/225.7, 205, 203, 207, 156, 154, 365/194; 257/372, 500, 205, 304, 296; 438/57, 199; 327/218, 210, 200, 215, 327/203, 212, 211; 341/156–165
See application file for complete search history.

(56) References Cited

U.S. PATENT DOCUMENTS

| | | | | |
|---|---|---|---|---|
| 4,800,300 A | * | 1/1989 | Walters, Jr. | 327/210 |
| 4,965,468 A | * | 10/1990 | Nicollini et al. | 327/89 |
| 5,298,816 A | * | 3/1994 | Kaplinsky | 327/427 |
| 5,347,152 A | * | 9/1994 | Sundaresan | 257/304 |
| 5,504,703 A | * | 4/1996 | Bansal | 365/156 |
| 5,678,554 A | * | 10/1997 | Hossack et al. | 600/459 |
| 5,760,627 A | * | 6/1998 | Gregor et al. | 327/215 |
| 5,821,807 A | * | 10/1998 | Brooks | 327/540 |
| 6,084,455 A | * | 7/2000 | Matson | 327/200 |
| 6,163,285 A | * | 12/2000 | Lopata | 341/118 |
| 6,163,288 A | * | 12/2000 | Yoshizawa | 341/144 |
| 6,369,630 B1 | * | 4/2002 | Rockett | 327/210 |
| 6,377,098 B1 | * | 4/2002 | Rebeor | 327/210 |
| 6,404,686 B1 | * | 6/2002 | Aipperspach et al. | 365/205 |

* cited by examiner

*Primary Examiner* — Lam T Mai
(74) *Attorney, Agent, or Firm* — John R. Pessetto; Frank D. Cimino

(57) ABSTRACT

A low-power offset-stored CMOS latch includes, for example, a common current source that is arranged to provide a predetermined bias current for an offset storage phase and enable transistors that are arranged to couple a resolution bias current during a resolution period to a respective input pair device. The low-power offset-stored CMOS latch optionally includes current scaling to provide a resolution bias current that is larger than the predetermined bias current of the offset storage phase.

20 Claims, 4 Drawing Sheets

LOW-POWER OFFSET-STORED LATCH

BACKGROUND

Electronic circuits are designed using increasingly smaller design features to attain increased integration and reduced power consumption. An example of such electronic circuits includes latches that are formed using logic circuitry and/or memory structures formed on increasingly integrated circuits. Oftentimes, a latch is used as a final stage in a comparator (of a converter, for example), where the latch is arranged to provide signal amplification in order to generate logic-level signals with a minimum of delay. As the design features of integrated circuits are increasingly made smaller, the increased integration of the electronic circuits increasingly requires using latches that have fast response times and minimize power consumption of the electronic circuits formed in the integrated circuits.

SUMMARY

The problems noted above can be solved in large part by a low-power offset-stored latching system and method. A low-power offset-stored CMOS latch, for example, includes a common current source that is arranged to provide a predetermined bias current for an offset storage phase and includes enable transistors that are arranged to couple a resolution bias current during a resolution period to a respective input pair device. The low-power offset-stored CMOS latch optionally includes current scaling to provide a resolution bias current that is larger than the predetermined bias current of the offset storage phase.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "calibration" can include the meaning of the word "test." The term "input" can mean either a source or a drain (or even a control input such as a gate where context indicates) of a PMOS (positive-types metal oxide semiconductor) or NMOS (negative-type metal oxide semiconductor) transistor.

Figure 1:
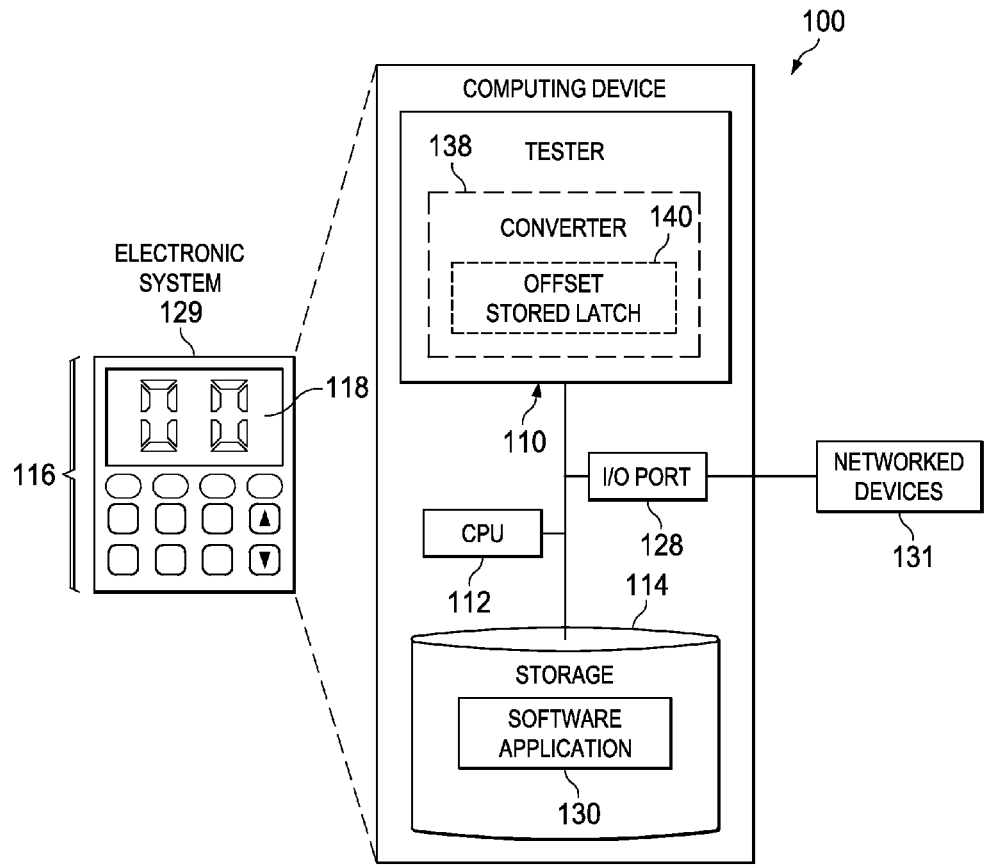
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a computer, electronics control "box" or display, communications equipment (including transmitters), or any other type of electronic system arranged to receive an alternating current.

In some embodiments, the computing device 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 and power supply 110 is coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 can also be coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 can be accessed by, for example, by the networked devices 131.

The tester 110 comprises logic that supports calibration, testing, and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The tester 110, for example, includes a converter (such as a 10-bit successive approximation-register converter) 138 that includes an offset-stored latch 140. Although the offset-stored latch 140 is illustrated as being included in the tester 110, the offset-stored latch 140 can be included multiple times within components of computing device 100 such as the CPU 112, storage 114, I/O port 128 and the like.

The CPU 112 and tester 110 are coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing device 100 by external devices using wireless or cabled connections. The CPU 112, storage 114, and tester 110 are also coupled to a power supply (not shown), which is configured to receive power from a power source (such as a battery, solar cell, "live" power cord, inductive field, fuel cell, and the like).

As discussed below with reference to the following figures, the offset-stored latch 140 is arranged, for example, to consume a low quiescent current during an offset storage phase of the offset-stored latch 140 and while also achieving a low resolution delay by boosting the current during a resolution phase of the offset-stored latch 140. The offset-stored latch 140 current in the resolution phase is typically a multiple of the bias current (IBIAS) and the multiplication factor (e.g., the value of the multiple of the IBIAS) is independent of PVT (power, voltage, and temperature) variations that result from differing manufacturing conditions.

By accurately determining an accurate IBIAS current, the delay of the offset-stored latch 140 and the power used by the offset-stored latch 140 can be controlled accurately. The offset-stored latch 140 reduces the latch power used over conventional solutions without necessarily impacting the degree of the latch offset of the offset-stored latch 140. The disclosed offset-stored latch 140 typically has a negligible impact on area layout requirements as only three additional transistors are added over some conventional designs.

Figure 2:
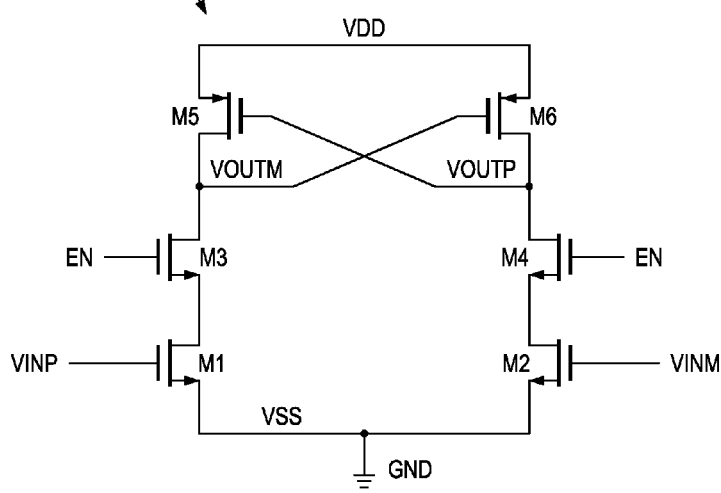
FIG. 2 is a schematic diagram illustrating a conventional CMOS latch.

FIG. 2 is a schematic diagram illustrating a conventional CMOS latch. Generally described, the (conventional) latch 200 includes CMOS transistors M1, M2, M3, M4, M5, and M6. The latch 200 is arranged to latch the state of an input signal (VINP) coupled to the gate of M1 and of the complement input signal (VINM) coupled to the gate of M2 when an enable signal (EN) is asserted at the gates of transistors M3 and M4. The state of the latch 200 is output using the complementary signals VOUTM (voltage out minus) and VOUTP (voltage out plus).

Accordingly, transistors M1 and M2 form the input stage (e.g., of transistors) of the latch 200, while transistors M3 and M4 are arranged as enable switches. Transistors M5 and M6 are arranged as an output stage regenerative load pair that is configured to maintain the state of the latch by using cross-coupled control signals. However, the latch 200 frequently encounters a high input referred offset that is due to a voltage threshold (VT) mismatch between the latch input pair (M1 and M2) and the regenerative load pair (M5 and M6). Furthermore, the latch gain of latch 200 and the latch 200 offset is sensitive to input common-mode noise in the input signal.

Figure 3:
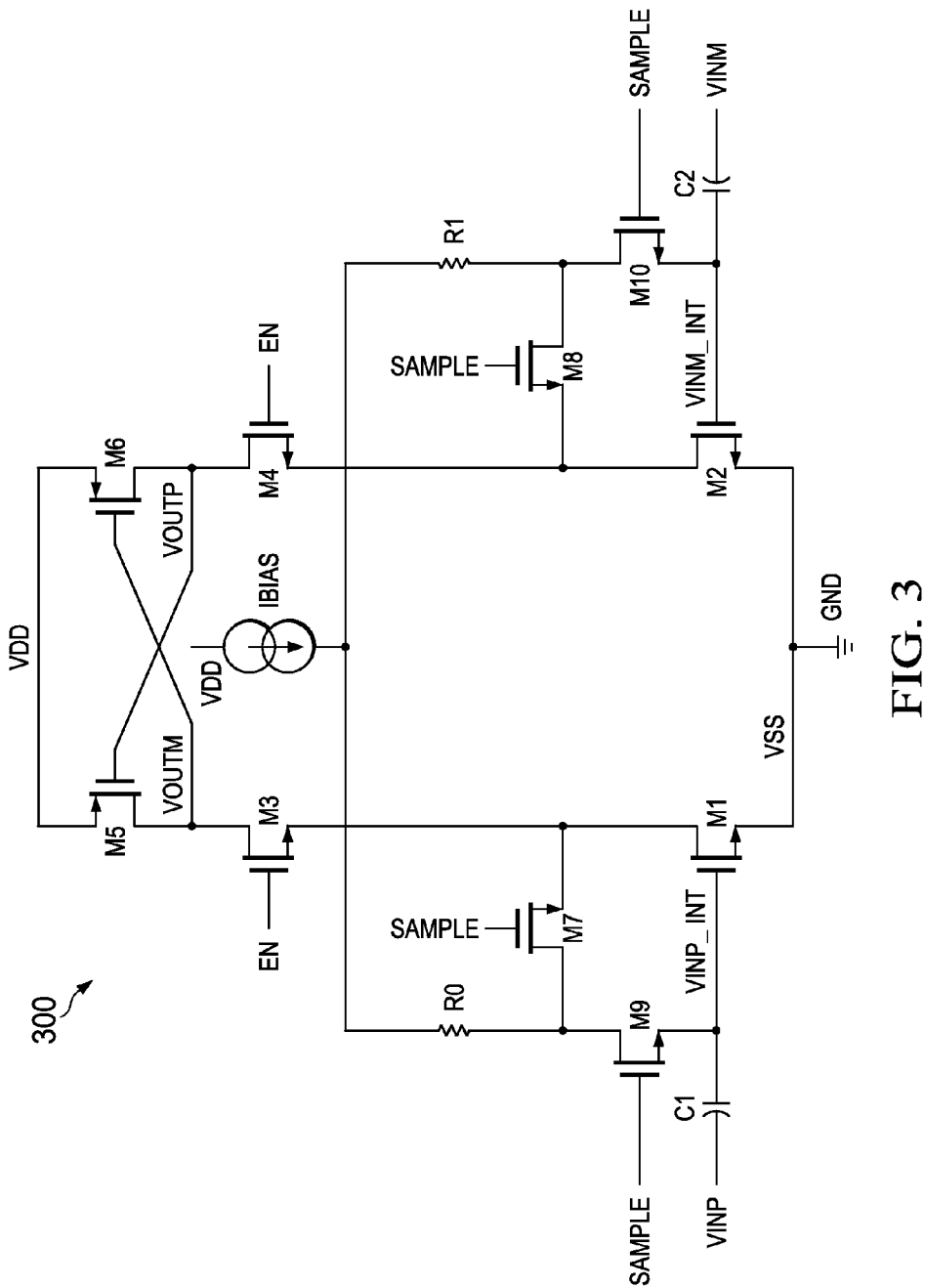
FIG. 3 is a schematic diagram illustrating a low-power offset-stored CMOS latch in accordance with example embodiments of the disclosure.

FIG. 3 is a schematic diagram illustrating a low-power offset-stored CMOS latch in accordance with example embodiments of the disclosure. Latch 300 is, for example, a latch such as the offset-stored latch 140 introduced above. Generally described, the latch 300 includes CMOS transistors M1, M2, M3, M4, M5, M6, M7, M8, M9, and M10, current source IBIAS, resistors R0 and R1, and capacitors C1 and C2.

Latch 300 is arranged as a differential amplifier, where transistors M1 and M2 are arranged as amplifiers to form the latch input pair; transistors M5 and M6 form the (e.g., cross-coupled) regenerative latch load transistors; and transistors M3 and M4 are arranged as the latch enable switches. Transistors M7, M8, M9, and M10 are arranged as switches controlled by the SAMPLE signal (which are closed in response to the assertion of a logic "1" level during the offset storage phase). The input of the latch is capacitively coupled (e.g., alternating current-coupled) via capacitors C1 and C2. Accordingly, signal VINP_INT (which is coupled to the control input of M1) is generated in response to signal VINP and signal VINM_INT (which is coupled to the control input of M2) is generated in response to signal VINM during the offset regeneration phase.

The latch 300 is arranged having a latch offset with a relatively low value. The relatively low latch offset value typically reduces the amount of gain required by a preamplifier (for example) of a comparator that incorporates the latch 300. Reducing the amount of the pre-amplifier gain requirement can lead to having a lesser number of pre-amplifier stages and, accordingly, a lower power consumption (and/or faster speeds) of a comparator. As described more fully below, the latch offset is reduced by applying an input offset storage technique to help mitigate the amount of the input pair VT-mismatch (e.g., the threshold voltage mismatch between transistors M1 and M2).

Figure 5:
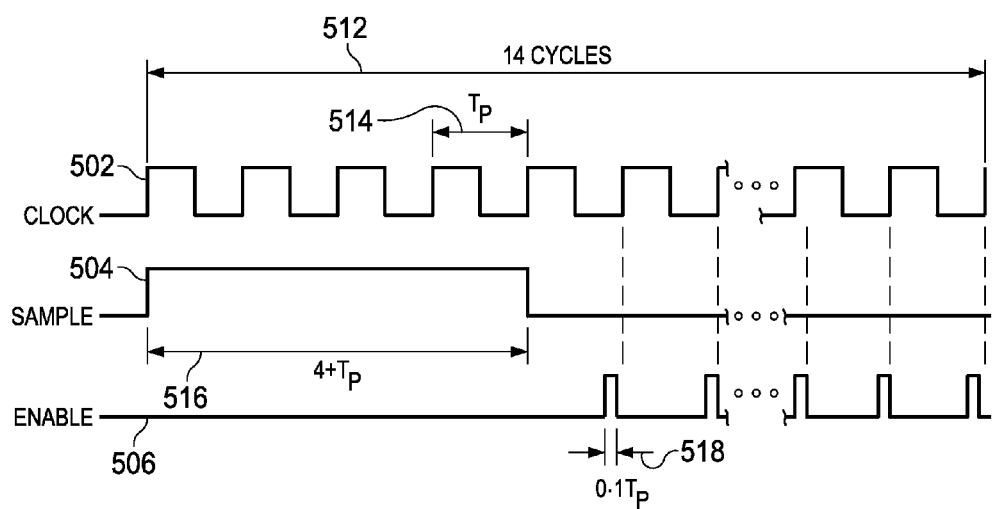
FIG. 5 is a timing diagram illustrating an example conversion period of a low-power, offset-stored CMOS latch in accordance with example embodiments of the disclosure.

The latch 300 is arranged to operate having two kinds of states: an offset storage phase and one or more resolution phases (illustrated in FIG. 5, for example). During the offset storage phase, the SAMPLE signal is set to, for example, a logic "1" and the enable signal (EN) is set to a logic "0." During the resolution phase, the SAMPLE signal is, for example, a logic "0" and the EN signal is a logic "1."

In operation, the offset storage phase is typically performed over several clock cycles during which transistors (e.g., switches) M7, M8, M9, and M10 are closed (in response to the assertion SAMPLE signal). When transistors (e.g., switches) M7, M8, M9, and M10 are closed, the input pair M1 and M2 are biased with current IBIAS via resistors R0 and R1 respectively. The values of resistors R0 and R1 are determined so as to minimize the error in offset stored as discussed below. When transistors (e.g., switches) M7, M8, M9, and M10 are closed, resistor R0 provides a portion of the IBIAS current to the source of input transistor M1 and to the gate of input transistor M1. Likewise, when transistors (e.g., switches) M7, M8, M9, and M10 are closed, resistor R1 provides a portion of the IBIAS current to the source of input transistor M2 and to the gate of input transistor M2. During the offset storage phase (e.g., in which the signal VINP_INT has settled to a final value), no current flows into the gate of transistor M1 or into the gate of transistor M2). Accordingly, the sources and gates of the input transistors M1 and M2 respectively are set to a predetermined level (such as the level of the operating voltage VDD) and the offset voltage is cancelled.

When the SAMPLE signal is de-asserted (e.g., at the end of the offset storage phase), current is blocked from flowing through the transistor M1 because transistors M9 and M7 (and in the case of transistor M2, because transistors M10 and M8) are turned off.

The resolution phase typically is performed during a fraction (e.g., less than one-half) of a clock cycle during which transistors (e.g., switches) M7, M8, M9, and M10 are open and the enable transistors (e.g., switches) M3 and M4 are closed. When the SAMPLE signal is negated, the input signal (VINP) is capacitively-coupled (via capacitor C1) to the gate of M1, which biases transistor M1 as a function of the input signal. Likewise, when the SAMPLE signal is negated, the complementary input signal VINM is capacitively-coupled (via capacitor C2) to the gate of M2, which biases transistor M2 as a function of the input signal. When the enable signal EN is asserted at the gates of transistors M3 and M4, the latch 300 settles to a voltage that is actively determined in response to the relative degrees of biasing of each of the input pair transistors M1 and M2. The active feedback mechanism (e.g., provided via the regenerative load pair M5 and M6 of latch 300) maintains the latched value when the enable signal EN is negated. The resolution phase is typically completed in a period of time that is less than the delay of a preamplifier that is configured to receive the output (e.g., the complementary signals VOUTM and VOUTP) of the latch 300.

The latch delay is inversely proportional to the bias current and accordingly the latch delay can be minimized by appropriately determining the magnitude of the bias current. For example, the strength of the bias current is determined as a function of the operating voltage (VDD), the capacitance of the latch load capacitor (e.g., the capacitance associated with signals VOUTP and VOUTM), and an expected latch delay. Assuming an operating voltage of 1.0 volts, a latch load capacitance of 50 femto-Farads, and a latch delay of 250 picoseconds, the bias current can be determined by multiplying the operating voltage by the latch load capacitance and then dividing by the latch delay. Accordingly, IBIAS=(50 fF*1.0V)/250 pSec=200 micro-amperes.

In contrast with the conventional latch 200 which does not have offset storage, the disclosed latch 300 has an offset storage phase that is substantially longer than the resolution phase. Offset storage in latch 300 helps to save current compared to the current consumption of latch 200. For example, in a circuit designed for a given latch offset and delay specification, smaller transistors can be used (e.g., because latch 300 has offset storage capability). The smaller transistors allow for smaller capacitors to be used, which in turn results in a lesser current than would otherwise be used in a latch having an architecture similar to latch 200.

As illustrated below with respect to FIG. 5, latch 300 can be used in a 10-bit SAR (successive-approximation register) converter (such as converter 138) that has an offset storage phase of 4.0 clock cycles and a resolution time of 0.1 clock cycles per bit of resolution (e.g., 1.0 clock cycles for 10 bits). Assuming the SAR comparator performs the resolution phase 10 times (once for each bit of resolution), the length of the conversion period (the length of the period over which the resolution phases are performed and the length of the offset storage phase) is 14.0 clock cycles and the total length of the time the bias current is activated is 5.0 clock cycles. Accordingly, the average latch current can be calculated in accordance with the following: the time the bias current is activated (e.g., 5.0 clock cycles) times the IBIAS current, the quantity divided by the conversion period (e.g., 14 clock cycles). Assuming an IBIAS current of 200 uA (as described above), the average latch current is around 70 uA.

Figure 4:
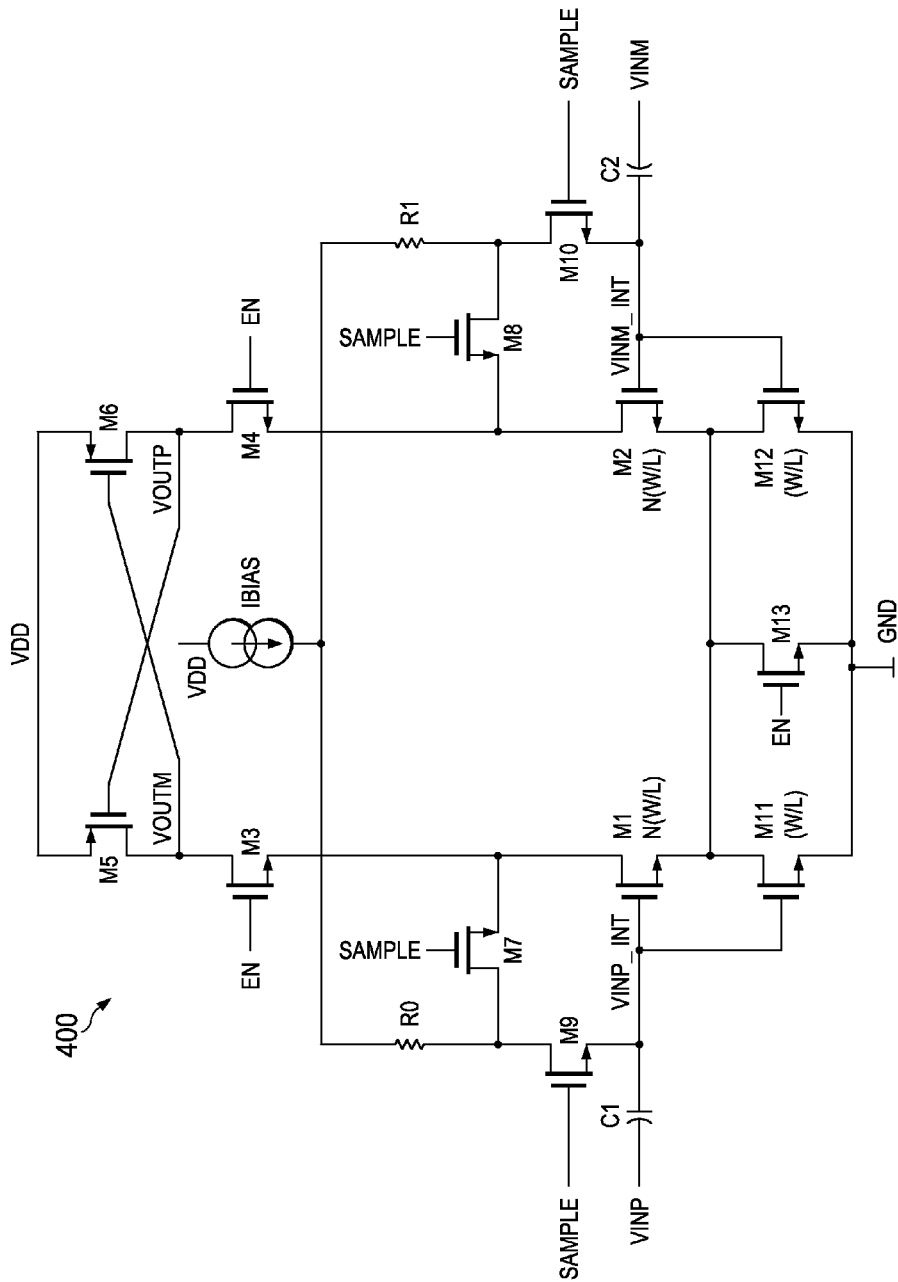
FIG. 4 is a schematic diagram illustrating a low-power, offset-stored CMOS latch having a scaled bias current in accordance with example embodiments of the disclosure.

FIG. 4 is a schematic diagram illustrating a low-power, offset-stored CMOS latch having a scaled bias current in accordance with example embodiments of the disclosure. Latch 400 is, for example, a latch such as the offset-stored latch 140 introduced above. Generally described, the latch 400 includes CMOS transistors M1, M2, M3, M4, M5, M6, M7, M8, M9, M10, M11, M12, and M13 current source IBIAS, resistors R0 and R1, and capacitors C1 and C2.

In latch 400, transistors M1 and M2 form the latch input pair; transistors M5 and M6 form the regenerative latch load transistors; and transistors M3 and M4 are arranged as the latch enable switches. Transistors M7, M8, M9, and M10 are arranged as switches controlled by the SAMPLE signal (which are closed in response to the assertion of a logic "1" level during the offset storage phase). The input of the latch is AC-coupled (alternating current-coupled) via capacitors C1 and C2. Accordingly, signal VINP_INT is generated in response to signal VINP and signal VINM_INT is generated in response to signal VINM.

Transistor M11 is coupled in series with transistor M1 and has a gate region having a width-to-length ratio that is the multiplicative reciprocal (e.g., 1/N) of the width-to-length ratio of transistor M1. The gates of both transistor M1 and M11 are coupled to the VINP_INT signal. Likewise, transistor M12 is coupled in series with transistor M2 has a gate region having a width-to-length ratio that is the multiplicative reciprocal (e.g., 1/N) of the width-to-length ratio of transistor M2. The gates of both transistor M2 and M12 are coupled to the VINM_INT signal. The drains of both transistors M11 and M12 are coupled to the drain of transistor M13, which has a gate coupled to the enable signal EN and a source coupled to ground (as are the drains of transistors M11 and M12). The operation of the transistors M11, M12, and M13 are discussed following. Examples of multiplicative reciprocals can include values such as unity, one-half, one-third, one-quarter, one-fifth, one-sixth, one-seventh, one-eighth, one-ninth, one-tenth, and so on down to and past an example embodiment of one-sixtieth. The multiplicative reciprocals are not necessarily integer multiples, and accordingly can have any value between the discrete values listed herein.

The latch 400 is arranged to operate having two kinds of operating states: the offset storage phase and one or more resolution phases. During the offset storage phase, the SAMPLE signal is, for example, a logic "1" and the enable signal (EN) is a logic "0." During the resolution phase, the SAMPLE signal is, for example, a logic "0" and the EN signal is a logic "1."

In operation, the offset storage phase is typically performed over several clock cycles during which transistors (e.g., switches) M7, M8, M9, and M10 are closed (in response to the assertion SAMPLE signal). When transistors (e.g., switches) M7, M8, M9, and M10 are closed, the input pair M1 and M2 are biased with current IBIAS via resistors R0 and R1 respectively. The values of resistors R0 and R1 are determined to provide a predetermined bias current (IBIAS) that provides an estimated current that is equal to the total current flowing through transistors M3 and M4 as discussed below.

When transistors (e.g., switches) M7, M8, M9, and M10 are closed, resistor R0 provides a portion of the IBIAS current to the source of input transistor M1 and to the gate of input transistor M1. In this phase (the offset storage phase), the transistors M1 and M11 operate as an equivalent transistor having an aspect ratio of $N*W/((N+1)/L)$, where N is the width-to-length ratio of the respective gates of transistor M1 to M11, W is the width of the gate region of transistor M11, and L is the length of the gate region of transistor M11. In an embodiment, transistor M12 has the same width-to-length ratio as transistor M11.

Likewise, when transistors (e.g., switches) M7, M8, M9, and M10 are closed, resistor R1 provides a portion of the IBIAS current to the source of input transistor M2 and to the gate of input transistor M2. The gate voltages VINP_INT and VINM_INT adjust suitably to carry the bias current Ibias through input transistors M1 and M2. Accordingly, the sources and gates of the input transistors M1 and M2 respectively are set to a predetermined level (such as the level of the operating voltage VDD).

When the SAMPLE signal is de-asserted, current does not flow through the transistor M1 because transistors M9 and M7 (and in the case of transistor M2, because transistors M10 and M8) are turned off.

The resolution phase typically is performed during a fraction (e.g., less than one-half) of a clock cycle during which transistors (e.g., switches) M7, M8, M9, and M10 are open and the enable transistors (e.g., switches) M3 and M4 are closed. When the SAMPLE signal is negated, the input signal (VINP) is capacitively-coupled (via capacitor C1) to the gate of M1, which biases transistor M1 as a function of the input signal. Likewise, when the SAMPLE signal is negated, the complementary input signal VINM is capacitively-coupled (via capacitor C2) to the gate of M2, which biases transistor M2 as a function of the input signal. When the enable signal EN is asserted at the gates of transistors M3 and M4, the latch 400 settles to a voltage that is actively determined in response to the relative degrees of biasing of each of the input pair transistors M1 and M2. The active feedback mechanism (e.g., provided via the regenerative load pair M5 and M6 of latch 400) maintains the latched value after the enable signal EN is negated. The resolution phase is typically completed in a period of time that is less than the delay of a preamplifier that is configured to receive the output (e.g., the complementary signals VOUTM and VOUTP) of the latch 400.

The latch delay is inversely proportional to the bias current and accordingly the latch delay can be minimized by appropriately determining the bias current. For example, the strength of the bias current is determined as a function of the operating voltage (VDD), the capacitance of the latch load capacitor (e.g., capacitor C1), and an expected latch delay. Assuming an operating voltage of 1.0 volts, a latch load capacitance of 50 femto-Farads, and a latch delay of 250 picoseconds, the bias current can be determined by multiplying the operating voltage by the latch load capacitance and then dividing by the latch delay. Accordingly, IBIAS=(50 fF*1.0V)/250 pSec=200 micro-amperes.

In contrast to the latch 300, latch 400 includes a transistor (e.g., switch) M13 that is closed in the resolution phase and (effectively and substantially) shorts out transistors M11 and M12 (e.g., by coupling the respective sources to ground via the gate region of transistor M13). During the offset storage phase the current IBIAS is typically a trickle current flowing into the NMOS transistors M1 and M2. During the resolution phase the bias current is greatly boosted for a fraction of the time (e.g., while reading the latch), which raises the bias current (from the level of IBIAS in the offset storage phase) to an amount expressed as (N+1)*IBIAS in the resolution phase. This bias current scaling is independent of PVT conditions and depends only on the ratio N. Accordingly, the latch 400 has substantially reduced power consumption, for example, when the bias current is raised from levels from the reduced levels of the offset storage phase.

In accordance with the example illustrated below with respect to FIG. 5, latch 400 can be used in a 10-bit SAR (successive-approximation register) converter (such as converter 138) that has an offset storage phase of 4.0 clock cycles and a resolution time of 0.1 clock cycles per bit of resolution (e.g., 1.0 clock cycles for 10 bits). Assuming the SAR comparator performs the resolution phase 10 times (once for each bit of resolution), the length of the conversion period (the length of the period over which the resolution phases are performed and the length of the offset storage phase) is 14.0 clock cycles and the total length of the time the bias current is activated is 5.0 clock cycles.

When N is 60, the current boost factor in the resolution phase is 61 (from N+1). Accordingly, the average latch current can be calculated in accordance with the following equation: ((IBBoost/(N+1))*No*Tp)+(IBBoost*Tr*Nr*Tp))/Nc*Tp, where IBBoost is the boosted bias current, N is the width-to-length ratio of the respective gates of transistor M1 to M11, No is the number of a clock cycles (e.g., 4 clock cycles) in the offset conversion phase, Tp is the time period of a clock cycle, Tr is the resolution time (e.g., 0.1 clock cycles) of each resolution phase, Nr is the number of clock cycles (e.g., 10 clock cycles) of the resolution phases, and Nc is the number of clock cycles (e.g., 14 clock cycles) of the conversion period.

Using the provided examples, the average latch current can be expressed as follows: ((IBBoost/(61))*4*Tp)+(IBBoost*0.110r*Tp))/14*Tp, which reduces to IBBoost/14. Assuming an IBIAS current of 200 uA for IBBoost, the average latch current is around 14 uA, which represents a current of around one-fifth the average bias current of latch 300. Accordingly, different values of N can be used, for example, to produce average currents for latch 400 that range from around 100 percent to values that are smaller than 20 percent of the average bias current of latch 300 (where minimum sufficient the trickle current required for offset cancellation during the offset storage phase is typically a limiting factor). Examples of such percentages include 100, 90, 80, 70, 60, 50, 40, 30, and 20 percent.

The architecture of latch 400 helps avoid unpredictability that arises from PVT-related variations and from device modeling of conventional solutions. In contrast, the operation of latch 400 includes, for example, the trickle current flowing in an offset storage phase, and boosting a known current during one or more resolution phases. Accordingly, the current carried by the M1 and M2 during the an offset storage phase is less than a current carried by M1 and M2 during the an offset storage phase Resistors are generally known to more closely match design parameters than do transistors for a given area. If two separate current sources are used, then the mismatch between each current source typically adds to the latch offset. Accordingly, latch 400 uses a single current source and two resistors to improve the latch offset. The latch offset is improved because latch 440 is typically independent of current source mismatch and dependent on resistor mismatch (which is generally very small as compared to the mismatch that would result from using transistorized current sources). Likewise, the mismatch from the "tail" node devices (e.g., transistors M11, M12, and M13) operating in linear transconductance region is minimized because the tail current is common to both the devices in the input pair (e.g., transistors M1 and M2).

The mismatch voltage offset sampled resulting from capacitors C1 and C2 can be expressed as Vmismatch*gm*R/(1+gmR), where Vmismatch (mismatch voltage offset) is the actual measured value, where gm is the gm of the NMOS (N-type Metal Oxide Semiconductor) input pair (e.g., transistors M1 and M2) in offset storage mode, and where R is the resistance of the respective resistor (e.g., resistor R0 and R1). By selecting the gm*R gain to be high, the error in the offset sampled is correspondingly lowered.

FIG. 5 is a timing diagram illustrating an example conversion period of a low-power, offset-stored CMOS latch in accordance with example embodiments of the disclosure. Diagram 500 includes a CLOCK signal 502, a SAMPLE signal 504, and an ENABLE signal 506.

The CLOCK signal 502 is active over a conversion period 512 of 14 cycles (not all cycles are shown for simplicity in illustration), wherein each cycle includes a positive pulse and a negative pulse. Each clock cycle has a time period (Tp) 514 that is typically the same as the other clock cycles. In various embodiments, a positive pulse and a negative pulse of a clock signal can be used to effect two clock cycles used for generating the sample and enable signals.

The SAMPLE signal 504 is asserted (e.g., rises) at the beginning of the offset storage phase and is de-asserted (e.g., falls) at the end of the offset storage phase. The offset storage phase is illustrated as lasting four clock cycles and accordingly has a time period 516 that extends from a first rising edge of the CLOCK signal 502 to a fifth rising edge of the CLOCK signal 502.

The ENABLE signal 506 has a time period 518 that is less than one-half of a phase of the CLOCK signal 502. The ENABLE signal 506 is asserted (e.g., rises) at the beginning of a resolution phase and is de-asserted (e.g., falls) at the end of the resolution phase, which occurs at the sixth rising edge of the CLOCK signal 502. In a 10-bit SAR converter, for example, ten resolution phases are used (not all resolution phases are shown for simplicity in illustration). Each resolution phase has a time period 518 that ends during a rising edge of a successive cycle of CLOCK signal 502. Accordingly, the conversion period 512 includes four clock cycles that occur during time period 516 and 10 clock cycles during which one resolution period per clock cycle occurs.

In various embodiments, the resistors used for input sampling can be replaced with current mirrors.

In various embodiments, the common node used for the resistors can be set to a bias voltage instead of being set by a current source.

In various embodiments, the scaling factor (e.g., the ratio N as described above) can be varied to provide different ratios of the boosted bias current to the bias current of the offset storage phase.

In various embodiments, power scaling can also be performed by using resistor to replace the active devices (e.g., transistors M1 and M2) operating in a linear transconductance region. However, the difficulty determining currents (such as when designing the circuit) when driving the latch 400 in active mode typically increases when using resistors to replace the active devices.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A latch, comprising:
an output stage having a first output and a second output, wherein the first output is arranged to provide a first positive feedback loop for controlling the second output, and wherein the second output is arranged to provide a second positive feedback loop for controlling the first output; and
an input stage having a first input capacitively coupled to a control input of a first amplifier and a second input capacitively coupled to a control input of a second amplifier, wherein the first output is selectively coupled to a first signal input of the first amplifier and the second output is selectively coupled to a first signal input of the second amplifier during a resolution phase, wherein a bias current source is selectively coupled via a first resistor to the control input and to the first signal input of the first amplifier during an offset storage phase, and wherein the bias current source is selectively coupled via a second resistor to the control input and to the first signal input of the second amplifier during the offset storage phase.

2. The latch of claim 1, wherein the first resistor has a resistance that is the same as the second resistor.

3. The latch of claim 2, wherein the output stage comprises a PMOS (P-type metal oxide semiconductor) transistor including a source coupled to a positive supply rail, a gate that is coupled to the second output signal, and a drain that is coupled to the first output signal.

4. The latch of claim 3, wherein the first amplifier is an NMOS (N-type metal oxide semiconductor) transistor having a gate region that is arranged having a first width-to-length ratio and wherein the second amplifier is an NMOS transistor having a gate region that is arranged having the first width-to-length ratio.

5. The latch of claim 4, wherein a current carried by the first and second amplifier during the offset storage phase is less than a current carried by the first and second amplifier during the resolution phase.

6. The latch of claim 5 wherein a current carried by the first and second amplifier during the offset storage phase is less than a current carried by the first and second amplifier during a plurality of the resolution phases.

7. The latch of claim 6, wherein the plurality of resolution phases occurs after each offset storage phase.

8. The latch of claim 5, comprising:
a first transistor including a drain coupled to the source of the NMOS transistor of the first amplifier, a source that is coupled to a ground, and a gate that is coupled to the gate of the NMOS transistor of the first amplifier; and
a second transistor including a drain coupled to the source of the NMOS transistor of the second amplifier, a source that is coupled to a ground, and a gate that is coupled to the gate of the NMOS transistor of the second amplifier, wherein the first and second transistors are arranged to conduct less current than each of the NMOS transistors of the first and second amplifiers respectively.

9. The latch of claim 8, wherein a width-to-length ratio of the gate region of the first transistor is a multiplicative reciprocal of the width-to-length ratio of the gate region of the NMOS transistor of the first amplifier, and wherein the width-to-length ratio of the gate region of the second transistor is a multiplicative reciprocal of the width-to-length ratio of the gate region of the NMOS transistor of the second amplifier.

10. The latch of claim 9, comprising a third transistor including a drain coupled to both the sources of the respective NMOS transistor of the first and the second amplifiers, the third transistor including a source coupled to ground.

11. The latch of claim 10, wherein the third transistor, during the resolution phase, is arranged to carry a portion of the current carried by the first and second amplifiers during the resolution phase.

12. The latch of claim 10, wherein the third transistor is arranged to conduct a majority of all the current carried by the first and second amplifiers during the resolution phase, wherein the average current carried by the first and second amplifiers during the resolution phase is greater than the average current carried by the first and second amplifiers during the offset storage phase.

13. A converter system, comprising:
an output stage having a first output and a second output, wherein the first output is arranged to provide a first positive feedback loop for controlling the second output, and wherein the second output is arranged to provide a second positive feedback loop for controlling the first output;
an input stage having a first input capacitively coupled to a control input of a first amplifier and a second input capacitively coupled to a control input of a second amplifier, wherein the first output is selectively coupled to a first signal input of the first amplifier and the second output is selectively coupled to a first signal input of the second amplifier during a resolution phase, wherein a bias current source is selectively coupled via a first resistor to the control input and to the first signal input of the first amplifier during an offset storage phase, and wherein the bias current source is selectively coupled via a second resistor to the control input and to the first signal input of the second amplifier during the offset storage phase; and
a converter that is arranged to generate a sample signal and an enable signal in response to a clock signal wherein the enable signal is asserted during the resolution phase and the sample signal is asserted during the offset storage phase.

14. The system of claim 13, wherein a current carried by the first and second amplifier during the offset storage phase is less than a current carried by the first and second amplifier during the resolution phase.

15. The system of claim 13, wherein a plurality of resolution phases occurs after each offset storage phase, wherein each of the plurality of resolution phases is associated with a successive-approximation operation of a successive-approximation register-(SAR-) type analog-to-digital converter.

16. The system of claim 15, wherein the sample signal is asserted for a time period that is longer than a time period of a pulse of the clock signal during the offset storage phase and wherein the enable signal is asserted for a time period that is less than a time period of the pulse of the clock signal during the resolution phase.

17. The system of claim 16, wherein the enable signal is asserted for a time period that is around equal to or less than a fifth of the time period of the clock signal during the resolution phase.

18. A method of latching, comprising:
asserting a logic state of a first output of a latch in response to a second output of the latch and asserting a logic state of the second output in response to the first output;
capacitively coupling a first input of an input stage of the latch to a control input of a first amplifier, and capacitively coupling a second input of the input stage of the latch to a control input of a second amplifier;
selectively coupling the first output to a first signal input of the first amplifier during a resolution phase and selectively coupling the second output to a first signal input of the second amplifier during the resolution phase; and
selectively coupling a bias current source via a first resistor to the control input and to the first signal input of the first amplifier during an offset storage phase, and selectively coupling the bias current source via a second resistor to the control input and to the first signal input of the second amplifier during the offset storage phase.

19. The method of claim 18, wherein a current carried by the first and second amplifier during the offset storage phase is less than a current carried by the first and second amplifier during the resolution phase.

20. The method of claim 19, wherein a current carried by the first and second amplifier during the offset storage phase is respectively carried by a first and second transistor coupled to ground, and wherein a current carried by the first and second amplifier during the resolution phase is carried by a third transistor coupled to ground, the first and second transistors having width-to-length ratios that are less than a tenth of the width-to-length ratio of the third transistor.

\* \* \* \* \*